(12) United States Patent
Yin et al.

(10) Patent No.: US 9,515,169 B2
(45) Date of Patent: Dec. 6, 2016

(54) FINFET AND METHOD OF MANUFACTURING SAME

(71) Applicant: Institute of Microelectronics, Chinese Academy of Sciences, Beijing (CN)

(72) Inventors: Haizhou Yin, Poughkeepsie, NY (US); Yunfei Liu, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/904,140

(22) PCT Filed: Oct. 22, 2013

(86) PCT No.: PCT/CN2013/085643
§ 371 (c)(1),
(2) Date: Jan. 11, 2016

(87) PCT Pub. No.: WO2015/054928
PCT Pub. Date: Apr. 23, 2015

(65) Prior Publication Data
US 2016/0163832 A1 Jun. 9, 2016

(30) Foreign Application Priority Data
Oct. 14, 2013 (CN) .......................... 2013 1 0479356

(51) Int. Cl.
*H01L 29/66* (2006.01)
*H01L 29/78* (2006.01)
(Continued)

(52) U.S. Cl.
CPC ..... *H01L 29/66795* (2013.01); *H01L 21/0217* (2013.01); *H01L 21/02164* (2013.01);
(Continued)

(58) Field of Classification Search
CPC ........... H01L 29/66795; H01L 29/6653; H01L 29/7851; H01L 29/66545; H01L 29/785; H01L 29/66818
See application file for complete search history.

(56) References Cited

U.S. PATENT DOCUMENTS 8,592,280 B2 * 11/2013 Chang ............... H01L 29/66545
257/346
2005/0019993 A1  1/2005 Lee et al.
(Continued)

FOREIGN PATENT DOCUMENTS

CN  102456691 A  5/2012
CN  102881724 A  1/2013

OTHER PUBLICATIONS

International Search Report and Written Opinion mailed on Jul. 16, 2014 in International Application PCT/CN2013/085643.

*Primary Examiner* — David Vu
(74) *Attorney, Agent, or Firm* — Pillsbury Winthrop Shaw Pittman LLP

(57) ABSTRACT

There is provided a FinFET fabricating method, comprising: a. providing a substrate ; b. forming a fin on the substrate; c. forming a channel protective layer on the fin; d. forming a shallow trench isolation on both sides of the fin; e. forming a sacrificial gate stack and a spacer on the top surface and sidewalls of the channel region which is in the middle of the fin; f. forming source/drain regions in both ends of the fin; g. depositing an interlayer dielectric layer on the sacrificial gate stack and the source/drain regions, planarizing later to expose the sacrificial gate stack; h. removing the sacrificial gate stack stack to form a sacrificial gate vacancy and expose the channel region and the channel protective layer; i. covering a portion of the semiconductor structure in one end of the fin with a photoresist layer; j. removing a portion of the spacer not covered; k. removing the photoresist layer and
(Continued)

filling a gate stack in the sacrificial gate vacancy; l. planarizing the semiconductor structure formed by the foregoing steps to expose the channel protective layer and forming a first separated gate stack and a second separated gate stack. Comparing with the prior art, control ability of independent-gate-voltage FinFET can be effectively improved and it is good for device performance.

6 Claims, 3 Drawing Sheets

(51) Int. Cl.
  *H01L 21/02* (2006.01)
  *H01L 21/311* (2006.01)
  *H01L 21/762* (2006.01)
  *H01L 29/06* (2006.01)
(52) U.S. Cl.
  CPC .. *H01L 21/31116* (2013.01); *H01L 21/76224* (2013.01); *H01L 29/0649* (2013.01); *H01L 29/6653* (2013.01); *H01L 29/66545* (2013.01); *H01L 29/66818* (2013.01); *H01L 29/785* (2013.01); *H01L 29/7851* (2013.01)

(56) References Cited

U.S. PATENT DOCUMENTS

2005/0051825 A1  3/2005  Fujiwara et al.
2012/0104509 A1  5/2012  Matsumoto

\* cited by examiner

FINFET AND METHOD OF MANUFACTURING SAME

CROSS REFERENCE TO RELATED APPLICATION

This application is a national stage application, filed under 35 U.S.C. §371, of PCT Application No. PCT/CN2013/085643, filed on Oct. 22, 2013, entitled "FINFET AND METHOD OF MANUFACTURING SAME", which claimed priority to Chinese Application No. 201310479356.3, filed on Oct. 14, 2013, all of which are hereby incorporated by reference in their entirety.

TECHNICAL FIELD

The present disclosure generally relates to a semiconductor device and a method of fabricating the same, and in particular, to a FinFET device and a method of fabricating the same.

BACKGROUND

With dimensional scaling of semiconductor device, threshold voltage decreases with the reduction of channel length, that is to say, short channel effects arise in semiconductor device. Fin Field Effect Transistor, namely, namely, FinFET is developed to face the challenge from semiconductor design and manufacture.

FinFET generally falls into two categories: one is unified-gate-voltage FinFET, that is to say, both gates are controlled by a unified voltage so that the gates are connected in parallel and easy to control; the other is independent-gate-voltage FinFET, that is to say, two gates on both sides of the fin are controlled by different voltage so that channels along both fin sides can be controlled in distinct status through distinct gate voltage. The independent-gate-voltage FinFET has better performance because it can independently control voltages of two gates and channel currents can be turned off more easily.

Two gates on both sides of the fin in an independent-gate-voltage FinFET are with the same dimensions and shape, therefore, two ends of the channel can not be effectively controlled and the device performance may be severely affected.

To resolve the foregoing problems, a method for manufacturing a novel asymmetric FinFET is provided in the present invention. Specifically, the method comprises steps: removing a sacrificial gate stack to form a sacrificial gate vacancy, then covering a photoresist layer on a portion of the semiconductor structure on one side of a fin, and thinning or removing a portion of the spacer which is not covered by the photoresist layer to make the vacancy width in the covered side larger than that in the opposite side, such that a gate stack formed later has a larger width in the covered side larger than that in the opposite side, and the gate stack in the covered side covers the total channel and source/drain extension regions, and voltages on both sides of the channel may be controlled better, control ability of both gates of the independent-gate-voltage FinFET can be effectively enhanced and device performance can be improved.

SUMMARY

There is provided a FinFET fabricating method, comprising: a. providing a substrate; b. forming a fin on the substrate; c. forming a channel protective layer on the fin; d. forming a shallow trench isolation on both sides of the fin; e. forming a sacrificial gate stack and a spacer on the top surface and sidewalls of the channel region which is in the middle of the fin; f. forming source/drain regions in both ends of the fin; g. depositing an interlayer dielectric layer on the sacrificial gate stack and the source/drain regions, planarizing later to expose the sacrificial gate stack; h. removing the sacrificial gate stack to form a sacrificial gate vacancy and expose the channel region and the channel protective layer, wherein the channel region and the channel protective layer are in the middle of the fin; i. covering a portion of the semiconductor structure which is formed in the foregoing steps with a photoresist layer, wherein the portion of the semiconductor structure is on one side of the fin; j. thinning or removing a portion of the spacer which is not covered by the photoresist layer; k. removing the photoresist layer and filling a gate stack in the sacrificial gate vacancy; l. planarizing the semiconductor structure formed by the foregoing steps to expose the channel protective layer, wherein the gate stack is divided into a first separated gate stack and a second separated gate stack.

In one aspect of the present invention, the channel protective layer is made of silicon dioxide and/or silicon nitride.

In one aspect of the present invention, the spacer is made of silicon nitride and the thickness of the spacerranges from 7~15 nm.

In one aspect of the present invention, the method of removing the spacer includes isotropic dry etching.

In one aspect of the present invention, the width of the second separated gate stack is larger than that of the first separated gate stack in the opposite side.

Accordingly, there is provided a FinFET, comprising: a substrate; a fin on the substrate; a channel protective layer on the fin; source/drain regions in both ends of the fin; a shallow trench isolation on both sides of the fin; an interlayer dielectric layer on both sides of the fin, wherein the shallow trench isolation is covered by the interlayer dielectric layer; a first separated gate stack on one side of the fin and a second separated gate stack on the opposite side of the fin, wherein the width of the second separated gate stack is larger than that of the first separated gate stack; and a spacer located between the first separated gate stack and the interlayer dielectric layer.

In one aspect of the present invention, the channel protective layer is made of silicon dioxide and/or silicon nitride.

In one aspect of the present invention, the spacer is made of silicon nitride and the thickness of the spacer ranges from 7 to 15 nm.

According to the novel asymmetric FinFET fabricating method, which comprises: after the sacrificial gate stack removed and sacrificial gate vacancy formed, covering a portion of the semiconductor structure which is formed in the foregoing steps with a photoresist layer, wherein the portion of the semiconductor structure is on one side of the fin, then removing a portion of the spacer which is not covered by the photoresist layer, the vacancy width in the covered side is equal to the sum of the vacancy width and the corresponding adjacent spacer in the opposite side, such that the gate stack formed later in one side may have a smaller width than that in the opposite side, and the larger gate stack portion covers the whole channel region and the source/drain extension regions on both sides of the channel region. Comparing with the prior art, control ability of independent gate voltage FinFET can be effectively enhanced and it is good for device performance in various aspects.

DETAILED DESCRIPTION

Figure 7:
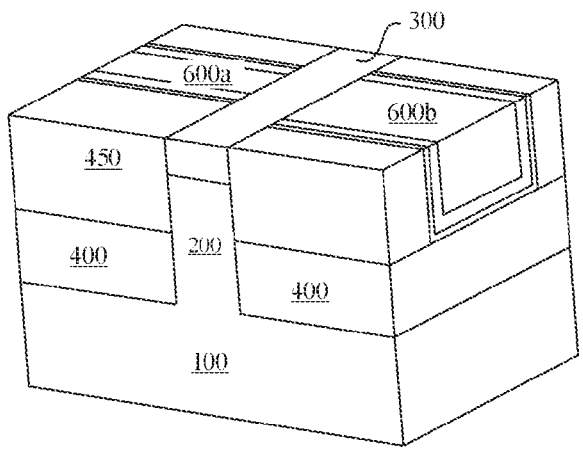

Referring to FIG. 7, there is provided a FinFET a substrate 100; a fin 200 on the substrate 100; a channel protective layer 300 on the fin 200; source/drain regions in both ends of the fin 200; a shallow trench isolation 400 on both sides of the fin 200; an interlayer dielectric layer 450 on both sides of the fin 200, wherein the shallow trench isolation 400 is covered by the interlayer dielectric layer 450; a first separated gate stack 600a on one side of the fin 200 and a second separated gate stack 600b on the opposite side of the fin 200, wherein the width of the second separated gate stack 600b is larger than that of the first separated gate stack 600a; and a spacer 505 located between the first separated gate stack 600a and the interlayer dielectric layer 450.

The two separated gate stack 600a and 600b provided in the present invention have different thicknesses, a separated gate stack on one side of the fin has a lager width than that on the opposite side, the larger separated gate stack covers the whole channel region and the source/drain extension regions on both sides of the channel region. The asymmetric structure enables the device a better control of both channel voltages and a better performance.

In one embodiment, the channel protective layer 300 is made of silicon dioxide and/or silicon nitride.

In one embodiment, the spacer 505 is made of silicon nitride, and the thickness of the spacer 505 ranges from 7 to 15 nm.

The substrate 100 may comprise a silicon substrate (for example, a silicon wafer). In one embodiment, the substrate 100 may comprise a variety of doping configurations. In other embodiments, the substrate may comprise other basic semiconductors, for example, Ge or compound semiconductor materials, such as SiC, GaAs, InAs or InP. Specifically, the substrate 100 may have a thickness range of, but not limited to, 400 um-800 um.

The fin 200 is formed by etching the substrate 200, such that it has the same material and crystal orientation as the substrate 100, normally, the fin 200 has a length in a range of 80~200 nm and a thickness in a range of 30-50 nm. Source and drain regions are deposited in both ends of the fin 200 and have a same length. A channel region is located in the middle of the fin 200 and just between the source and drain regions with a length in a range of 30-50 nm.

More details of the present invention may be described in the following with reference to the drawings. Each part of the drawings is not drawn to scale for purpose of clarity.

It could be understood that, while describing device structures, when a layer/element is recited as being "on" a further layer/element, the layer/element can be disposed directly on the further layer/element, or otherwise there may be an intervening layer/element interposed there between. Further, if a layer/element is "on" a further layer/element in an orientation, then the layer/element can be "under" the further layer/element when the orientation is turned.

To describe a situation such as directly on another layer, another area, "on . . . " or "on . . . and adjacent to" is adopted in the specification.

Many particular details according to the present invention are described in the following, for example, device structure, material, dimension, operation process and technique, for purpose of clarity and comprehension. Those skilled in the art may understand the invention can be practiced by modifications and revisions not limited to the particular details. For example, a semiconductor material for the substrate and fin can be chosen from group IV semiconductors, such as Si or Ge, or groups III-V semiconductors, such as GaAs, InP, GaN, Si, or a stack of the foregoing semiconductor materials.

Firstly, a semiconductor fin 200 is formed on a substrate 100. Just for an example, the substrate 100 and the fin 200 are formed by silicon. The fin 200 is formed by epitaxially growing a semiconductor layer on the substrate 100 and then etching the semiconductor layer, the epitaxy method may be Molecular Beam Epitaxy (MBE) or other methods and the etching method may be dry etching or dry/wet etching. The fin 200 height ranges from 100 to 150 nm.

Then, a silicon dioxide layer as the channel protective layer 300 is formed on the fin 200, such that the channel region can be protected in the following processes such as polish process. The thickness of the channel protective layer is 10-30 nm.

Then, the semiconductor formed after the foregoing processes is isolated to form a shallow trench isolation 400. Preferably, a silicon nitride layer and a buffer silicon dioxide pattern are formed on the fin 200 as a mask for later trench etching. Afterwards, a trench with a specific depth and spacer angle on the substrate 100 has been etched. Later, a thin silicon dioxide layer is grown to smooth the trench corner angle and remove the damages on the silicon surface induced in before etching process. The trench will be filled after the oxidation, wherein the dielectric material filled is silicon dioxide. Then the semiconductor structure formed after the foregoing process will be planarized by CMP process with the silicon nitride layer as a stop layer. Then, the semiconductor structure will be etched with the silicon nitride layer as a mask to restrain vertical diffusion in the fin 200 in a later diffusion process, wherein, the etching depth is lager than a desirable fin height, may be 20-60 nm. The shallow trench isolation 400 will be formed after the etching process, and the top surface of the shallow trench isolation 400 keeps the top surface of the fin 200 at a distance of 20~60 n. At last, the exposed silicon nitride will be removed by hot phosphoric acid to expose the fin 200.

Then, a sacrificial gate stack is formed on the channel region and source/drain regions are formed next. The gate stack may be a single layer or a multiple-layer. The gate stack may comprise polymer, amorphous silicon, poly silicon or TiN and the thickness may range from 10 to 100 nm. The gate stack may be formed by, but not limited to, the following method: thermal oxidation, chemical vapor deposition (CVD), atomic layer deposition (ALD), etc. The source/drain regions may be formed by, but not limited to, the following steps: ion implanting and then annealing to activate ions, situ doping and/or epitaxial growing.

Then, a spacer 505 are formed on the sidewalls of the sacrificial gate stack to isolate adjacent gate stacks. The spacer 505 may formed by silicon nitride. The spacer 505 may comprise a multiple-layer. The spacer may be formed by processes including depositing and etching, and the thickness ranges from 10 to 100 nm, for example, 30 nm, 50 nm or 80 nm.

Figure 1:
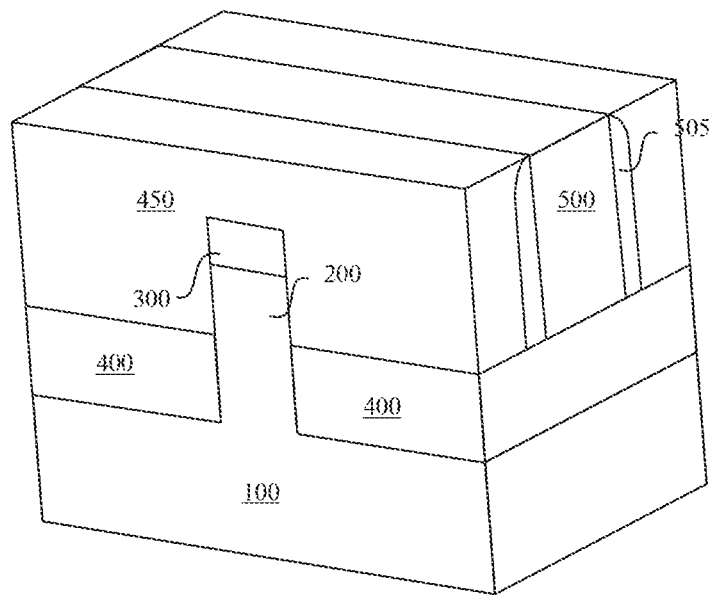
FIGS. 1-7 are 3-D isometric drawings schematically illustrating some steps for manufacturing the semiconductor Fin structure in accordance with the present disclosure.

Then, referring to FIG. 1, an interlayer dielectric layer 450 is deposited and planarized later to expose the sacrificial gate stack 500. Specifically, the interlayer dielectric layer 450 may be formed by CVD, high density plasma CVD, spin coating or other appropriate methods. The interlayer dielectric layer 450 may comprise $SiO_2$, carbon-doped $SiO_2$, BPSG, PSG, UGS, silicon oxy-nitride, low-k materials or any combination thereof. The thickness of the interlayer dielectric layer 450 may range from 40 to 150 nm, for example, 80 nm, 100 nm, or 120 nm. Then a planarization is performed to expose the sacrificial gate stack which may be flush with the interlayer dielectric layer 450 (the term "flush with" means, difference in height between the two is within a range of the semiconductor process error).

Figure 2:
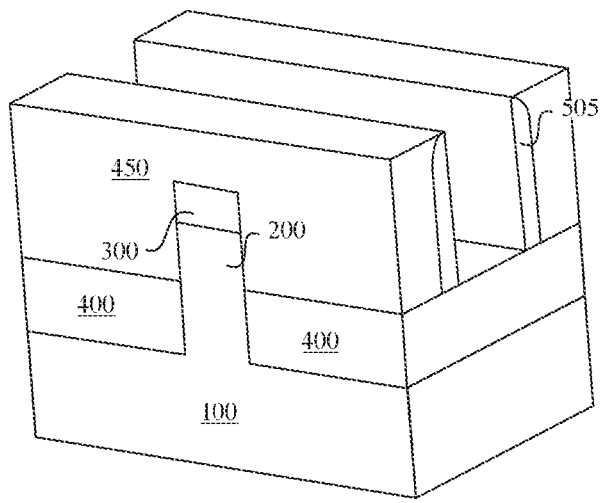

Then, referring to FIG. 2, the sacrificial gate stack 500 is removed to expose the channel region. Specifically, the sacrificial gate stack 500 may be removed by wet and/or dry etching. Plasma etching may also be employed in a specific embodiment.

Figure 3:
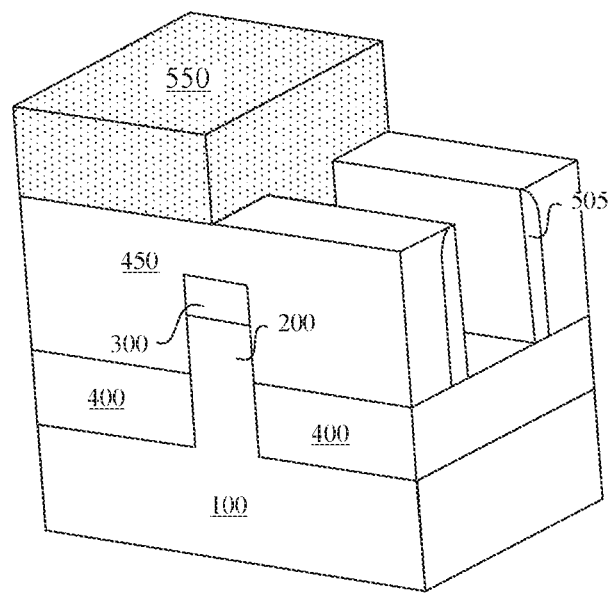
Figure 4:
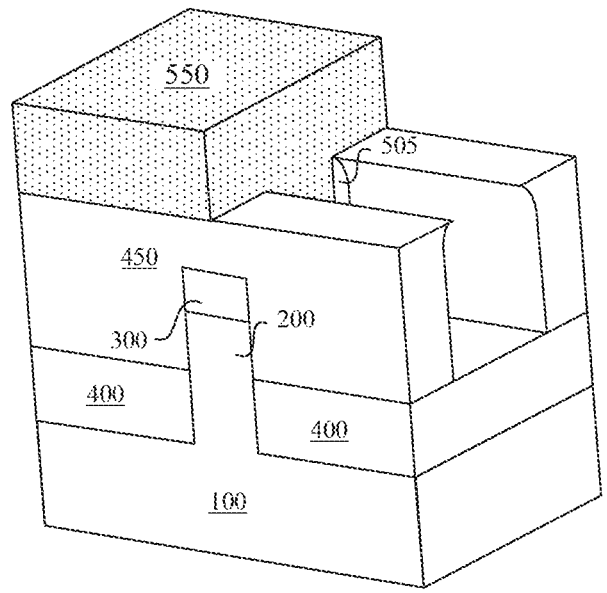
Figure 5:
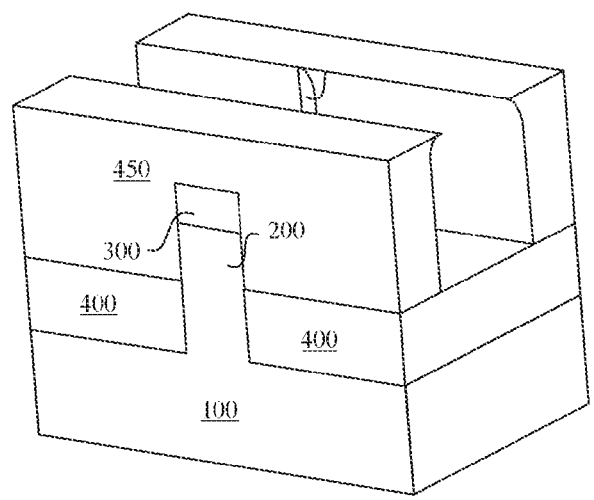

Then, referring to FIG. 3, a portion of the semiconductor structure on one side of the fin is covered with a photoresist layer 550 as a mask. The portion of the semiconductor structure on one side of the fin is covered by photoresist and a portion of the semiconductor structure on the opposite side of the fin is exposed. Then, a portion of the spacer 505 which is not covered by the photoresist layer 550 is removed by selective etching. Specifically, referring to FIG. 4, the nitride silicon material of the spacer 505 is selectively removed by isotropic wet etching method to form spacer vacancy without damaging other semiconductor materials. Then, the photoresist layer 550 is removed to expose the whole semiconductor structure formed by foregoing steps. Referring to FIG. 5, there is a portion of spacer 505 still in the portion of the semiconductor structure which was covered by the photoresist layer 550 before. As a result, the sacrificial gate vacancy has two ends, on is smaller than the opposite one.

Figure 6:
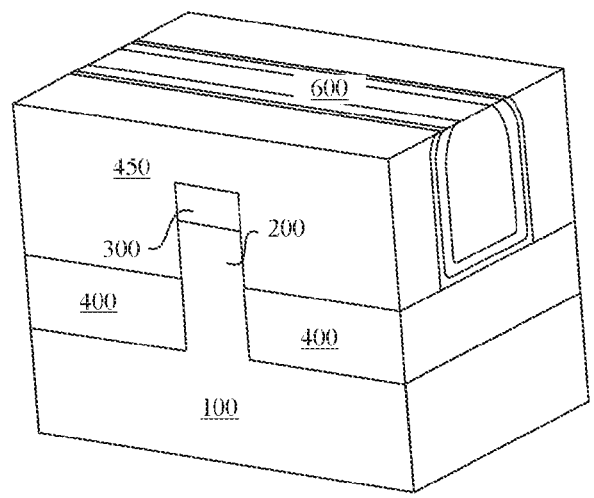

Then, referring to FIG. 6, there is formed a gate stack 600 in the sacrificial gate vacancy, comprising: a gate dielectric layer, a work-function tuning layer and a gate electrode metal layer. Specifically, the gate dielectric layer may be thermal oxidation layer including silicon oxide, silicon oxynitride; or a high-k dielectric material, for example, selected from any one or combination from the group of HfAlON、HfSiAlON、HfTaAlON、HfTiAlON、HfON、HfSiON、HfTaON、HfTiON、Al2O3、La2O3、ZrO2 and LaAlO. The gate dielectric layer thickness ranges from 1 to 10 nm, for example, 3 nm, 5 nm or 8 nm. The work-function tuning layer may formed by TiN, TaN, etc., and the thickness ranges from 3 to 15 nm. The gate electrode metal layer may comprise a single or a multiple layer and comprise materials selected from any one or combination from the group of TaN、TaC、TiN、TaAlN、TiAlN、MoAlN、TaTbN、TaErN、TaYbN、TaSiN、HfSiN、MoSiN、RuTax and NiTax. The gate electrode metal layer has a thickness ranges from 10 to 40 nm, for example, 20 nm or 30 nm.

Referring to FIG. 6, there is a portion of spacer 505 remained on one side of the fin, therefore, the portion of the gate stack in the same side has a width smaller than that in the opposite side.

Then, a chemical mechanical polish (CMP) process is performed to thin the semiconductor structure that is formed after the foregoing steps to expose the channel protective layer 300 on top of the fin. The gate stack 600 is subsequently divided from the middle part. As a result, two separated gate stacks are formed, that is to say, a first separated gate stack 600a and a second separated gate stack 600b. Because there is thinned spacer 505 or there is not a spacer in the side of the second separated gate stack 600b, the width of the second separated gate stack 600b is obviously larger than that of the first separated gate stack 600a which covering the whole channel region and the source/drain extension regions on both sides of the channel region. Therefore, carrier distribution in the channel region in the side of the second separated gate stack may be better controlled and the device performance may be improved with the cooperation of the first separated gate stack 600a.

According to the novel asymmetric FinFET fabricating method, which comprises: after the sacrificial gate stack removed and sacrificial gate vacancy formed, covering a portion of the semiconductor structure which is formed in the foregoing steps with a photoresist layer, wherein the portion of the semiconductor structure is on one side of the fin, then removing a portion of the spacer which is not covered by the photoresist layer, the vacancy width in the covered side may be equal to the sum of the vacancy width and the corresponding adjacent spacer in the opposite side, such that the gate stack formed later in one side may have a smaller width than that in the opposite side, and the larger gate stack portion covers the whole channel region and the source/drain extension regions on both sides of the channel region. Comparing with the prior art, control ability of independent gate voltage FinFET may be effectively improved and it is good for devices performance in various aspects.

Although the invention has been described with reference to the exemplary embodiments and advantages, it is understood that various changes and replacements and revisions may be made to the embodiments without departing the spirit and scope of the appended claims. For other exemplary embodiments, those skilled in the art may understand the order of the process steps can be changed within the present invention in its aspects.

Further, the present invention is not intend to limited to the particular details described in the specification, such as, technique, mechanism, fabrication, material composition, means, methods and steps. Those skilled in the art will recognize that for those elements already existing or to be developed, such as technology, mechanism, fabrication, material composition, means, methods or steps, if the elements used to be implement a specific function or result similar to the embodiments of the present invention, they can be employed according to the present invention. Therefore, those technology, mechanism, fabrication, material composition, means, methods and steps are in the scope of the appended claims.

We claim:
1. A method of fabricating a FinFET, comprising:
  a. providing a substrate (100);
  b. forming a fin (200) on the substrate;
  c. forming a channel protective layer (300) on the fin (200);
  d. forming a shallow trench isolation (400) on both sides of the fin (200);
  e. forming a sacrificial gate stack (500) and a spacer (505) on the top surface and sidewalls of the channel region which is in the middle of the fin;
  f. forming source/drain regions in both ends of the fin;
  g. depositing an interlayer dielectric layer on the sacrificial gate stack and the source/drain regions, planarizing later to expose the sacrificial gate stack (500);
  h. removing the sacrificial gate stack (500) to form a sacrificial gate vacancy and expose the channel region and the channel protective layer (300),wherein the channel region and the channel protective layer (300) are in the middle of the fin (200);
  i. covering a portion of the semiconductor structure which is formed in the foregoing steps with a photoresist layer

(550), wherein the portion of the semiconductor structure is on one side of the fin;

j. thinning or removing a portion of the spacer (505) which is not covered by the photoresist layer (550);

k. removing the photoresist layer (550) and filling a gate stack (600) in the sacrificial gate vacancy (600);

l. planarizing the semiconductor structure formed by the foregoing steps to expose the channel protective layer (300), wherein the gate stack 600 is divided into a first separated gate stack (600a) and a second separated gate stack (600b).

2. A method of claim 1, wherein the channel protective layer (300) is made of silicon dioxide and/or silicon nitride.

3. A method of claim 1, the spacer (505) are made of silicon nitride.

4. A method of claim 1, wherein the thickness of the spacer (505) ranges from 7~15 nm.

5. A method of claim 1, wherein the method of removing the spacer (505) includes isotropic dry etching.

6. A method of claim 1, wherein the width of the second separated gate stack (600b) is larger than that of the first separated gate stack (600a) in the opposite side.

* * * * *